United States Patent [19]
Gumm

[11] Patent Number: 5,521,532
[45] Date of Patent: May 28, 1996

[54] DIGITAL SYNTHESIZER CONTROLLED MICROWAVE FREQUENCY SIGNAL SOURCE

[75] Inventor: Linley F. Gumm, Beaverton, Oreg.

[73] Assignee: Tektronix, Inc., Wilsonville, Oreg.

[21] Appl. No.: 318,926

[22] Filed: Oct. 6, 1994

[51] Int. Cl.[6] ................................ H03L 7/12; H03L 7/20
[52] U.S. Cl. .................... 327/105; 327/100; 327/107; 327/119; 331/4; 331/178
[58] Field of Search ..................... 327/105, 107, 327/141, 119, 126, 100, 45, 147, 150, 156, 159, 106; 364/721, 718; 331/4, 19, 178

[56] References Cited

U.S. PATENT DOCUMENTS

| | | | |
|---|---|---|---|
| 4,144,579 | 3/1979 | Nossen et al. | 327/105 |
| 4,160,958 | 7/1979 | Mims et al. | 331/4 |
| 5,015,971 | 5/1991 | Taylor et al. | 331/4 |

Primary Examiner—Timothy P. Callahan
Assistant Examiner—Dinh T. Le
Attorney, Agent, or Firm—William K. Bucher; Daniel J. Bedell

[57] ABSTRACT

A signal source provides an output signal which can sweep over a broad frequency range in a well-controlled manner. The signal source includes a voltage controlled oscillator (VCO) producing the output signal and a waveform synthesizer producing a reference signal. The VCO output signal is phase locked to the reference signal. To make the VCO signal continuously sweep over a broad frequency range, the reference signal sweeps repeatedly over a narrow frequency range. During each sweep of the reference signal, the VCO frequency tracks an integer harmonic of the reference signal frequency. The frequency and phase of the reference signal for each successive sweep are abruptly reset at the beginning of each sweep selected such that the VCO signal frequency locks to another integer harmonic of the reference signal frequency and does not change. Thus the VCO signal frequency sweeps continuously throughout the successive sweeps of the reference signal frequency but is unaffected by abrupt changes in reference signal frequency between successive reference signal frequency sweeps.

3 Claims, 4 Drawing Sheets

DIGITAL SYNTHESIZER CONTROLLED MICROWAVE FREQUENCY SIGNAL SOURCE

BACKGROUND OF THE INVENTION

1. Field of the Invention

The present invention relates in general to digitally controlled microwave frequency signal sources and in particular to a signal source producing an output signal having a frequency that may vary over a wide range in a flexible and precisely controlled manner.

2. Description of Related Art

Microwave voltage controlled oscillators (VCO's) are the heart of many microwave devices. They are used in many communications devices and in microwave frequency test equipment. Like all oscillators, the VCO exhibits less than ideal characteristics including drift with time and temperature. Because the VCO is designed to change its frequency as a function of a control voltage, the VCO also exhibits another non-ideal characteristic, non-linearity of its frequency as a function of voltage. Even if the VCO did not have these problems, the small noise content present on any control voltage will FM modulate the VCO to a very undesirable degree. This noise FM modulation is in addition to the VCO's inherent random frequency modulation caused by random noise in the oscillator and the fact that all oscillators use a frequency determining network that has a limited Q. This random frequency modulation is called phase modulation. These factors are well known in oscillator literature.

When used in receivers, a microwave VCO is often the best alternative for providing the required LO signals. But the problems mentioned above cause a VCO to be a less than ideal component. To correct the oscillator's problems it is common to phase lock it to a frequency reference. One simple way of doing this is to sample the instantaneous amplitude of the oscillator's output signal at a submultiple of the oscillator's frequency and use the resulting error signal to control the VCO's frequency. A specially designed sampling circuit called a phase gate is used for this purpose. It is an electronic switch that periodically closes for a very short period (e.g. 50 pS) at a rate precisely controlled by a reference signal. According to well known theories, this switch will produce output signals that are the difference between the microwave VCO's frequency and the harmonics of the reference signal.

For example, the signal from a microwave VCO that is intended to operate at 2,000 MHz is sent to a sampling gate that is driven by a 2 MHz signal. The difference signal from the phase gate will be Phase Gate Output Freq.=|VCO Freq.−N * Ref. Freq.| where N is an integer. The 1000th harmonic of the reference signal is at 2,000 MHz. Therefore, if the VCO's signal is slightly too high, for example 2,000.5 MHz, the phase gate output frequency will be 0.5 MHz. The sample output frequency will be obtained if the VCO is at 1999.5 MHz. If this signal is passed through a suitable compensation amplifier to the control terminal of the VCO, the VCO will be tuned to exactly 2,000 MHz and held there. The advantage to this technique is that relatively simple hardware can transfer the frequency drift and phase noise characteristics of a low frequency oscillator to a microwave frequency VCO.

It is often desired to make the VCO tune or to linearly sweep over a wide frequency range. For instance, in a spectrum analyzer in wide spans a microwave VCO will be required to tune roughly an octave from about 2,000 MHz to 3,800 MHz to cover the spectrum analyzer's input frequency range. The analyzer's user may choose to examine an input frequency in detail that requires the VCO to exhibit low phase noise, very low frequency drift and high frequency accuracy at any frequency. This requires some arrangement to phase lock the microwave VCO at any frequency in its range.

This presents a problem. Note that if the microwave VCO is locked to the 1000th line of the reference and if the reference drifts by 1 Hz, the VCO drifts 1000 Hz. Similarly, if the reference oscillator has some phase noise, the VCO will have N times as much phase noise impressed upon it over the bandwidth of the phase lock loop. Therefore, the reference signal must be very pure. It is difficult to make a reference signal simultaneously tune over a large percentage of it output frequency and be very pure. Instead the reference signal is made to tune just far enough so that the VCO can be locked on the (Nth) harmonic of the reference signal at one tuning extreme and on the (Nth+1) harmonic at the other. This permits locking the microwave VCO at any point in its tuning range.

There is a problem if it is desired to tune or sweep the microwave VCO beyond the range where the reference signal can tune. In previous art, the tuning range of the reference signal was somewhat extended to allow some overlap of the microwave VCO's locked tuning range. To tune or sweep over a wider range, the system had to halt and spend time unlocking the microwave VCO, tuning the reference to the other end of its range, and re-locking the microwave VCO on the next reference harmonic. Obtaining a lock by the microwave VCO to the correct harmonic of the reference is often a complicated process which takes some time. Limitations in this process cause the selection of very high performance microwave VCO's that can be operated in certain span ranges without the benefit of a phase lock.

What is needed is a signal source which can produce a high frequency output signal having a frequency which can vary with time over a wide frequency range in an accurately controllable manner.

SUMMARY OF THE INVENTION

A microwave frequency signal source employs a voltage controlled oscillator (VCO) phase locked to a reference signal output of a direct digital synthesizer to produce a sweeping microwave frequency signal. The waveform synthesizer produces an output reference signal having a frequency and phase which can be programmed to change with time in a desired fashion, but within a relatively narrow frequency range. In accordance with the invention, the reference frequency abruptly changes from Fvco/N to Fvco/(N+1) without a phase discontinuity when it reaches the end of its tune range. This allows instantaneous reset of the reference signal without having to drop and regain phase lock with the microwave VCO. Thus the phase locked VCO signal frequency sweeps continuously over its full range while continuously phase locked to a reference signal.

It is accordingly an object of the invention to provide a signal source which can produce a high frequency output signal having a frequency which can vary with time over a wide frequency range in an accurately controllable manner.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 1:
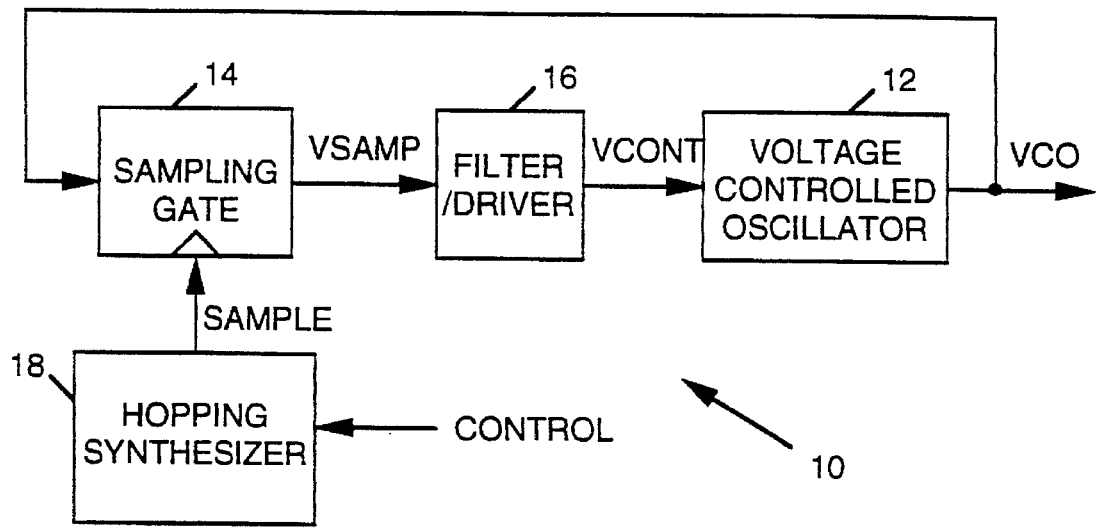
FIG. 1 is a block diagram illustrating a programmable signal source in accordance with the present invention.
Figure 4A:
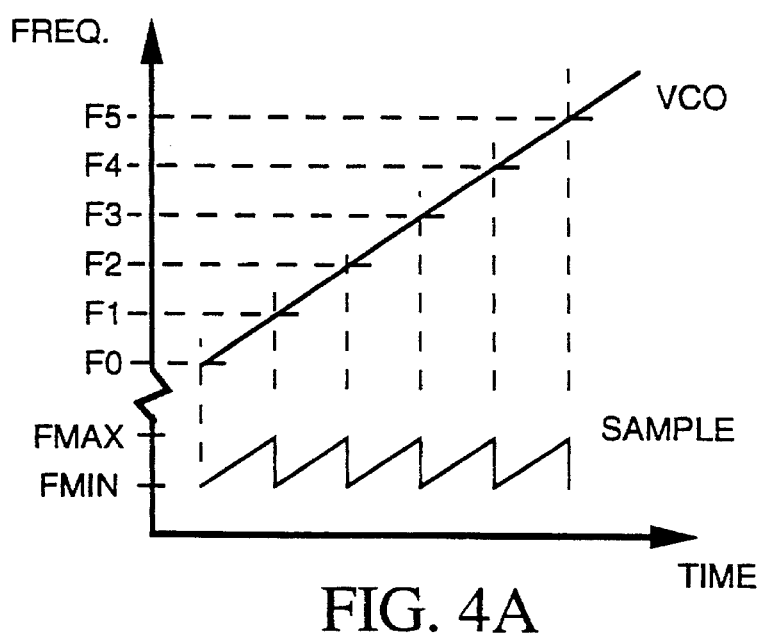
Figure 4B:
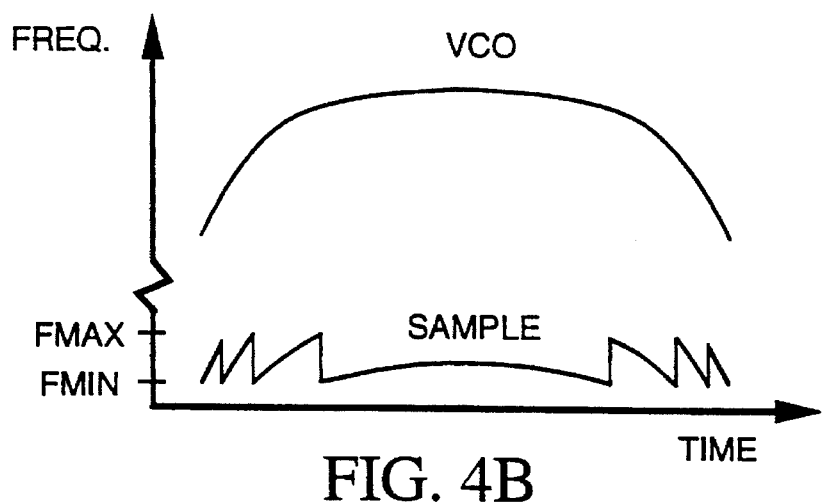
Figure 5:
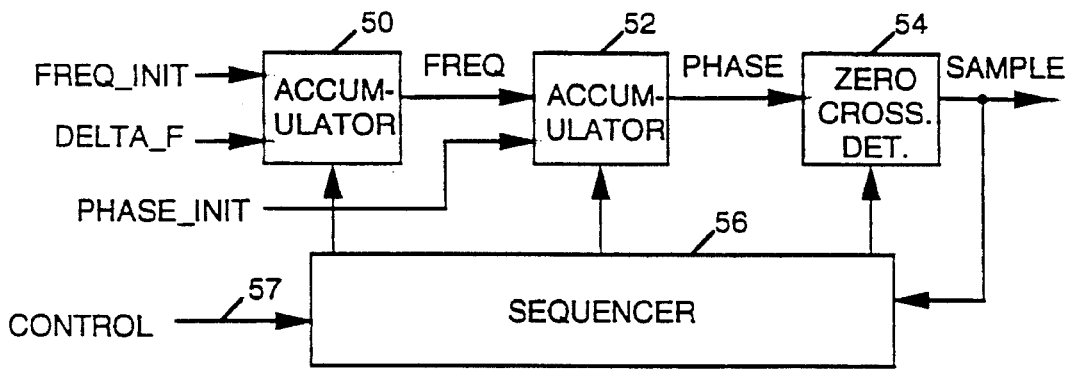
Figure 6:
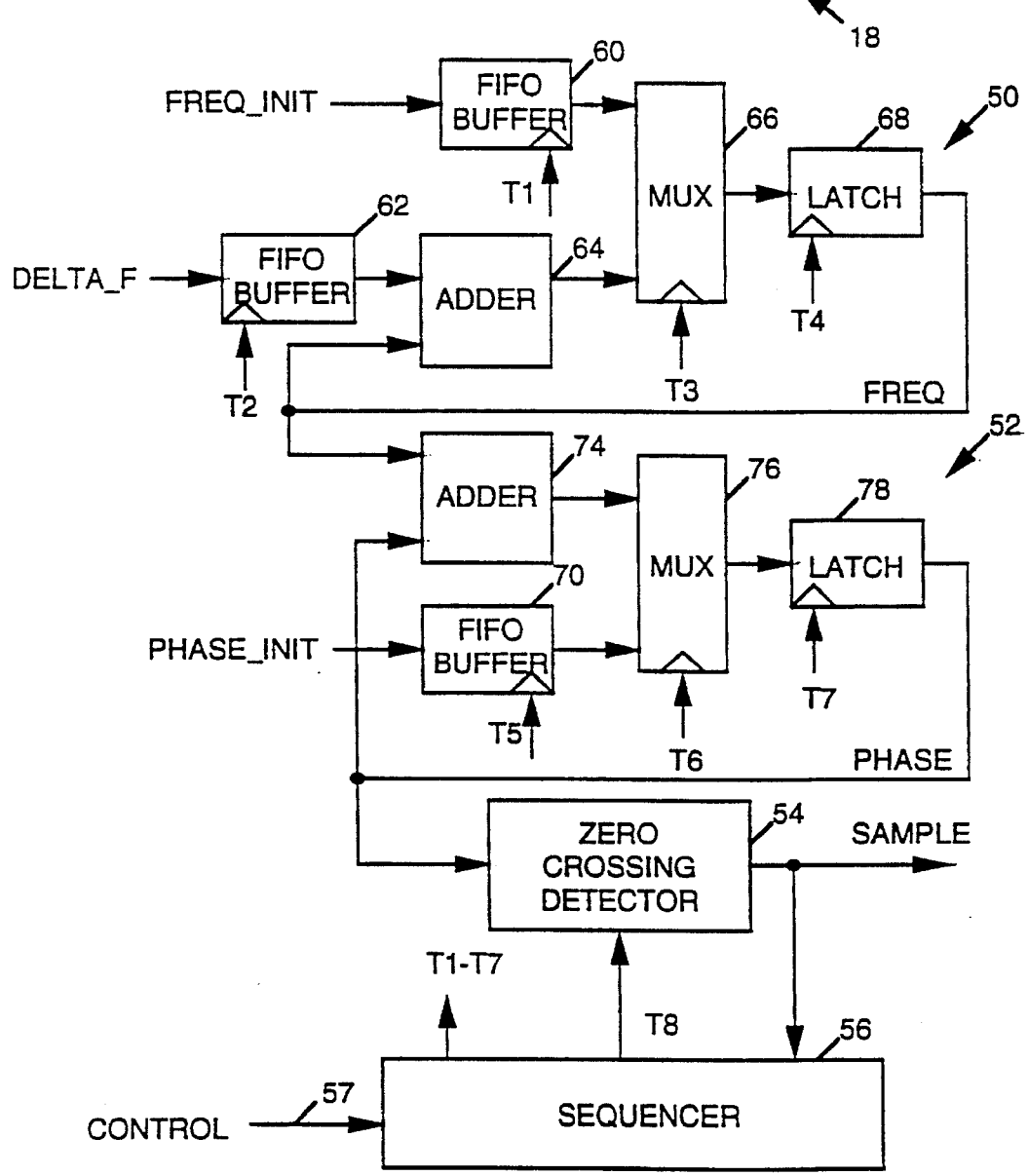
Figure 7:
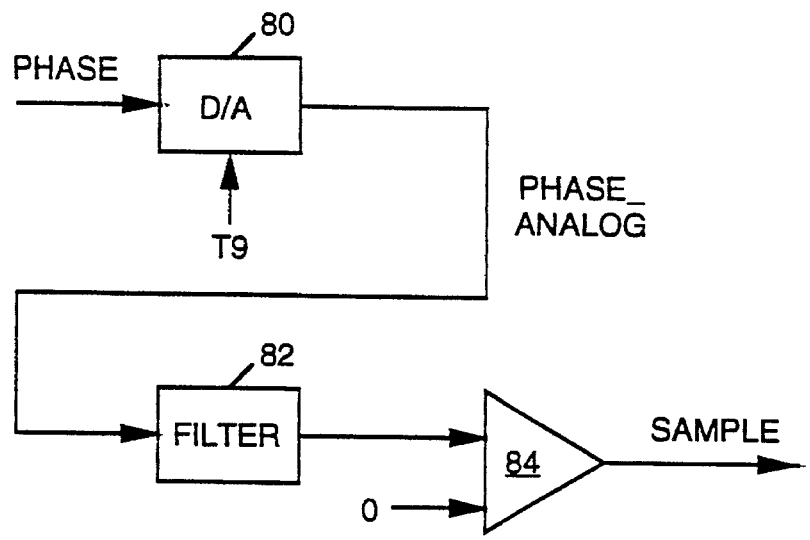
Figure 8:
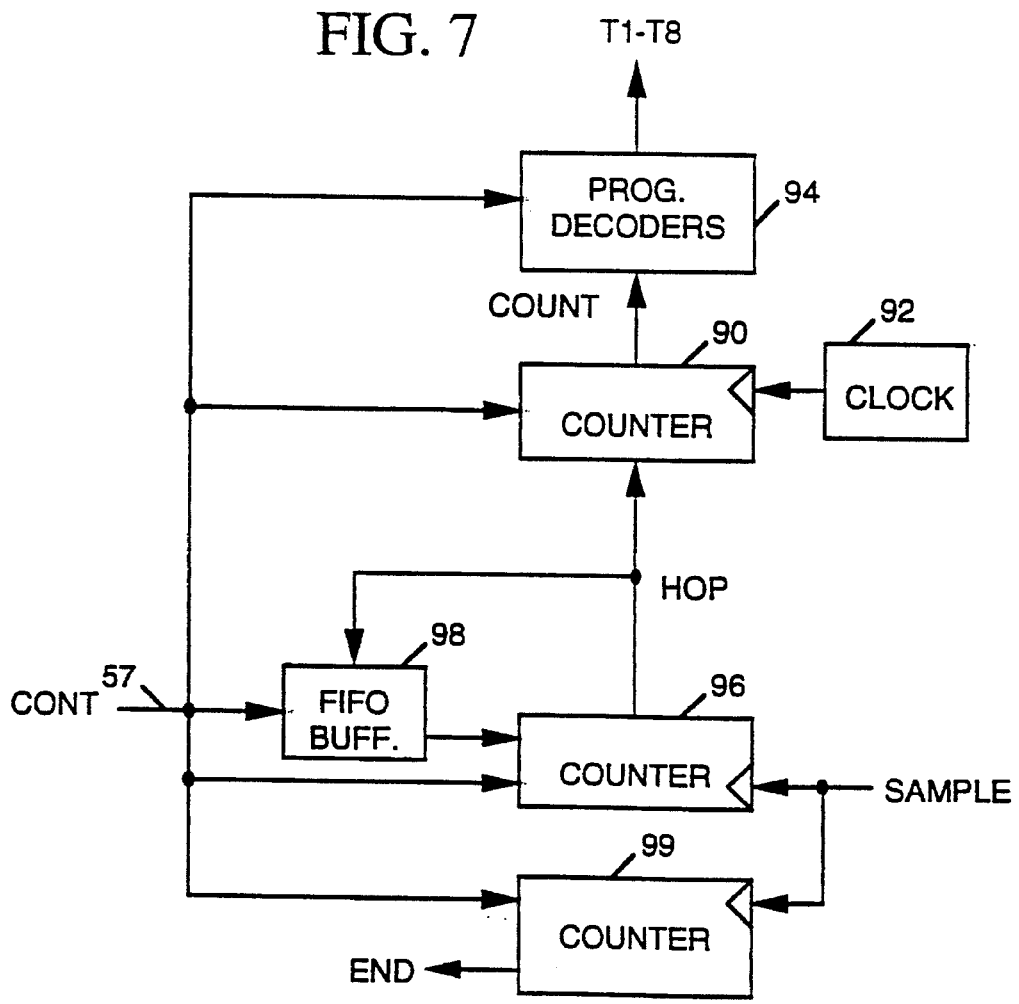

FIGS. 4A 4B and are graphs illustrating VCO and SAMPLE signal frequencies of FIG. 1 as functions of time;

FIG. 5 is a block diagram illustrating the hopping synthesizer 18 of FIG. 1;

FIG. 6 is a block diagram illustrating the hopping synthesizer of FIG. 5 in greater detail;

FIG. 7 is a block diagram illustrating the zero crossing detector of FIGS. 5 and 6; and FIG. 8 is a block diagram illustrating the sequencer of FIGS. 5 and 6.

DESCRIPTION OF THE PREFERRED EMBODIMENT(S)

FIG. 1 depicts in block diagram form a signal source 10 in accordance with the present invention. A conventional voltage controlled oscillator 12 generates an output signal VCO having a frequency proportional to the voltage of a control signal VCONT supplied as input to oscillator 12. A control circuit Producing VCONT consists of three elements, a sampling gate 14, a filter/driver 16 and a digital "hopping" synthesizer 18. The VCO signal is fed back to an input of sampling gate 14. Synthesizer 18 supplies an output signal SAMPLE to a control input of sampling gate 14. Whenever the SAMPLE signal crosses a predetermined level, sampling gate 14 samples the VCO signal and produces an output signal pulse VSAMP of amplitude equal to the instantaneous magnitude of VCO. Filter/driver 16 filters and amplifies the VSAMP signal to produce the VCONT signal that controls the frequency of oscillator 12. VCO 12, sampling gate 14, and filter/driver circuit 16 are conventional and well-known to those skilled in the art. The hopping synthesizer 18 is described in more detail herein below.

Figure 2:
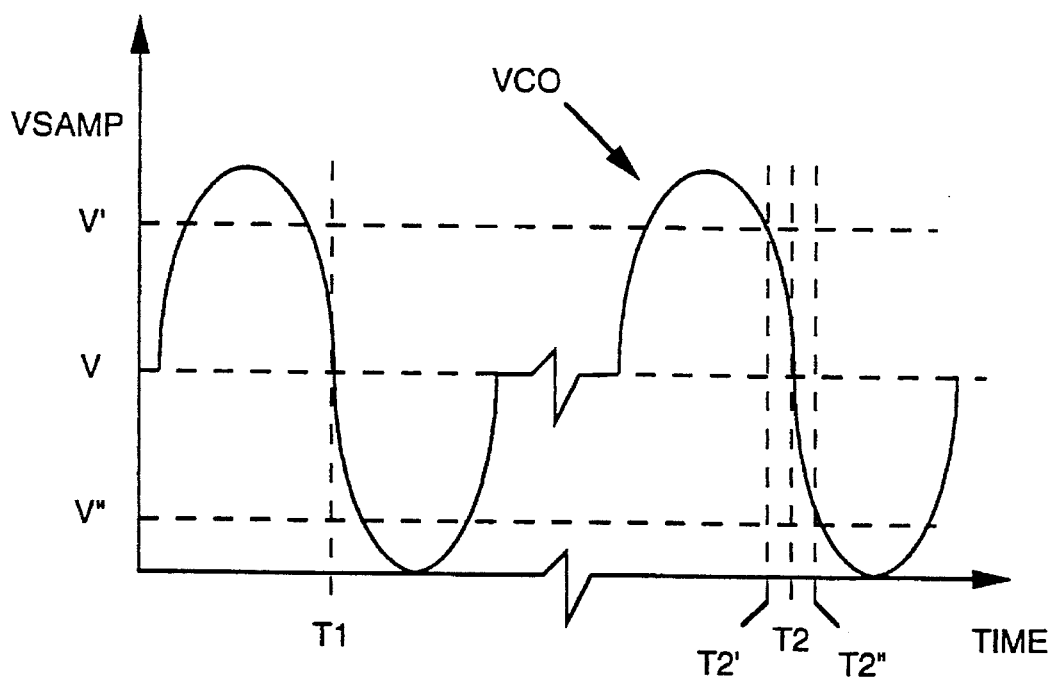
FIG. 2 is a chart representing relationships between frequencies of the VCO and SAMPLE signals of FIG. 1.

FIG. 2, is a chart representing relationships between the frequencies of the VCO and SAMPLE signals of FIG. 1. Assume sampling gate 14 samples the VCO signal at time T1 and produces a VSAMP signal proportional to voltage V. Suppose sampling gate 14 next samples the VCO signal N cycles later at a time T2. Since times T1 and T2 occur at the same relative phase along separate cycles the VCO output signal, the value of VSAMP at time T2 will again be V. Since VSAMP did not change between times T1 and T2, filter/driver 16 will not change the VCONT signal and the frequency of VCO will not change. Thus if sampling gate 14 consistently samples the VCO at the same relative point along its waveform, the frequency of the VCO signal will remain constant.

Suppose now that sampling gate 14 samples the VCO signal at an earlier time T2'. Then the VSAMP will have a value V' which is higher than the previous sample value V at time T1. Filter 16 will respond to the higher value V' by increasing VCONT. As VCONT increases, oscillator 12 increases the frequency of its output VCO signal and will continue to do so from sampling period to sampling period until VSAMP settles to a constant value. Conversely, if the second sample occurs at later time T2" instead of time T2, VSAMP will have a value V" which is lower than V. Filter 16 will reduce VCONT thereby causing oscillator to decrease the frequency of the VCO signal. Thus the feedback loop provided by sampling gate 14 and filter/driver 16 phase locks the VCO signal to the reference signal, SAMPLE. Since the SAMPLE and VCO signals are phase-locked, we can vary the VCO signal frequency by varying the SAMPLE signal frequency.

At first glance at the architecture of FIG. 1, one might assume that in order to make the VCO signal sweep from, for example 2110 to 3910 MHz, one would have to make the SAMPLE signal sweep over an 1800/N MHz range. But it is not feasible to construct a suitable synthesizer capable of sweeping over such a wide range with sufficient purity given the present state of the art. However, as discussed herein below, the VCO signal sweeps over a wide frequency range when the SAMPLE signal frequency repetitively swept over a much narrower frequency range.

Figure 3:
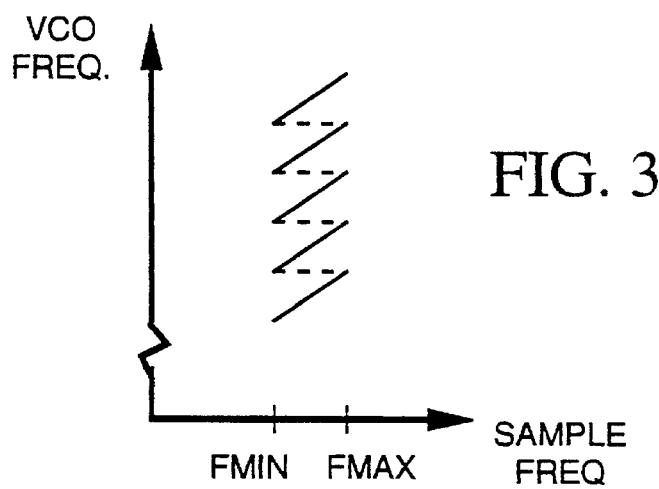
FIG. 3 is a graph depicting the frequency of the VCO signal of FIG. 1 as a function of the frequency of the SAMPLE signal.

FIG. 3 is a graph depicting relationships between the SAMPLE signal frequency and the VCO signal frequency where the SAMPLE signal frequency is constrained to a range between frequencies FMIN and FMAX. The system may phase lock the VCO signal to the SAMPLE signal even when the VCO signal is at a higher frequency than the SAMPLE signal. If the SAMPLE signal causes sampling gate 14 of FIG. 1 to sample every Nth cycle of the VCO signal, the VCO signal will be locked to the Nth harmonic of the SAMPLE signal frequency. When the VCO signal and the SAMPLE signal are phase locked, the VCO signal frequency will stabilize to some integer harmonic of the SAMPLE signal and there are many such harmonics. In FIG. 3 each sloping line corresponds to a different integer harmonic of the SAMPLE signal at which the VCO signal may reside.

FIG. 4A illustrates how the present invention makes the VCO signal frequency sweep linearly over a wide range. We see from FIG. 3 and FIG. 4A that starting with the VCO signal at the low end of its range we sweep the SAMPLE signal in a linear fashion Between FMIN and FMAX the VCO signal will sweep from F0 to F1. If we then abruptly reduce the SAMPLE signal frequency to an appropriate value near FMIN the VCO will phase lock to a higher harmonic of the SAMPLE signal. When we again sweep the SAMPLE signal frequency linearly to near FMAX, the VCO signal will sweep linearly from F1 to F2. By repeatedly sweeping the SAMPLE signal five or more times within the FMIN to FMAX range, we can cause the VCO signal to sweep linearly from F0 to F5.

FIG. 4B illustrates how the VCO signal frequency can vary with time in an arbitrary non-linear fashion over a wide frequency range by appropriately varying the SAMPLE signal frequency over its narrower range. Note that whenever the SAMPLE signal frequency sweeps up near FMAX, it abruptly hops back near FMIN and whenever the SAMPLE signal frequency sweeps downward near FMIN it abruptly hops up near FMAX. Note that the rate of change of the VCO curve is equal to the desired rate of change of the SAMPLE curve where the SAMPLE curve is continuous and that the VCO signal frequency is unaffected by the abrupt changes in the SAMPLE signal.

The VCO signal frequency will vary smoothly over time as illustrated in FIGS. 4A and 4B if we choose the starting and ending frequencies for each successive SAMPLE signal sweep so that the VCO signal frequency will not be affected by the abrupt SAMPLE signal frequency changes between sweeps. To that end we choose the SAMPLE signal frequency at the end of any sweep and at the beginning of the next sweep such that the VCO signal frequency is an integer harmonic of the SAMPLE signal frequency both before and after any abrupt SAMPLE signal frequency change. We also want to choose an appropriate phase for the SAMPLE signal relative to the VCO signal after the abrupt change to the SAMPLE signal frequency so that the next VCO signal sample occurs at the appropriate time. Referring back to FIG. 2, if the frequency hop occurs between sampling times T1 and T2, we want to make sure that the next sample occurs at time T2 and not at time T2' or time T2". Otherwise the VCO signal will not have the same phase relationship with the SAMPLE signal after the frequency hop and will exhibit transient frequency behavior until the system restores the appropriate phase relationship between the two signals.

FIG. 5 is a block diagram illustrating the hopping synthesizer 18 of FIG. 1 in accordance with the present invention. Synthesizer 18 includes a pair of accumulators 50 and 52, a zero crossing detector circuit 54 and a sequencer circuit 56. In response to timing and control signals from sequencer circuit 56, accumulator 50 periodically adds the value of input data DELTA_F (which may be positive or negative) to a stored data value FREQ. The magnitude of FREQ is proportional to the frequency of the output SAMPLE signal. When the FREQ data value changes with time, the frequency of the SAMPLE signal changes at the same rate. Also in response to timing and control signals from sequencer circuit 56, the second accumulator 52 periodically increments a stored data value PHASE by the value of the FREQ data output of the first accumulator 52. Thus accumulator 52 integrates the FREQ quantity over time to produce the PHASE data value. Since FREQ represents the frequency of the SAMPLE signal, and since the integral of a signal's frequency over time is its phase, the quantity PHASE is proportional to the desired phase of the SAMPLE signal. The zero crossing detector circuit 54 produces an output SAMPLE pulse whenever accumulator 52 overruns. Thus the SAMPLE signal phase is determined by the PHASE data and its frequency is determined by the FREQ data. Note that if DELTA_F is positive, the SAMPLE signal frequency will increase with time. If DELTA_F is negative, the SAMPLE signal frequency will decrease with time.

The sequencer circuit 56 is programmed by data from an external source via a control bus 57. Sequencer circuit 56 counts SAMPLE signal pulses and after a predetermined number of SAMPLE signal pulses initiates a "frequency hop" operation wherein the SAMPLE signal frequency abruptly changes. To execute a frequency hop, the sequencer circuit 56 transmits control signals to accumulators 50 and 52 setting their accumulated values FREQ and PHASE to FREQ_INIT and PHASE_INIT respectively. Thereafter accumulators 50 and 52 resume accumulating the FREQ and PHASE data values. Depending on the values for FREQ_INIT and PHASE_INIT supplied to accumulators 50 and 52 at each frequency hop, the SAMPLE signal frequency can be made, for example, to exhibit linear or non-linear frequency hopping behavior as illustrated in FIGS. 4A or FIG. 4B.

FIG. 6 illustrates the hopping synthesizer of FIG. 5 in greater detail. Accumulator 50 Of FIG. 5 is implemented by FIFO buffers 60 and 62, an adder 64, a multiplexer 66 and a latch 68. FIFO (first-in, first-out) buffer 62 stores a sequence of DELTA_F values from an external source, such as a computer, and provides them to an input of adder 64 on a first-in, first-out basis. The output of adder 64 is supplied to one input of multiplexer 66. FIFO buffer 60 stores a sequence of FREQ_INIT values from the external source and supplies them on a first-in, first-out basis to a second input of multiplexer 66 at each frequency hop. Latch 68 links the output of multiplexer 66 to a second input of adder 64. The FREQ value appears at the output of LATCH 68.

Accumulator 52 is implemented by a FIFO buffer 70, an adder 74, a multiplexer 76 and a latch 78. The FREQ data output of latch 68 is applied to one input of adder 74 while the PHASE data output of latch 78 is applied to a second input of adder 74. The output of adder 74 drives one input of multiplexer 76. FIFO buffer 70, which holds a sequence of PHASE_INIT values from the external source, shifts out a next value for FREQ_INIT onto a second input to multiplexer 76 at each frequency hop. Latch 78 couples the output of multiplexer 76 to a second input of adder 74.

Zero crossing detector circuit 54 produces a SAMPLE signal output pulse when the value of FREQ overruns in either direction past 0. The sequencer 56, responsive to the SAMPLE signal output of zero crossing circuit 54, provides a set of timing signals T1–T8 which control shift out of FIFO buffers 60, 62, and 70, the operation of latches 68 and 78, the switching of multiplexers 66 and 76, and the operation of zero crossing circuit 54.

To program the synthesizer, sets of successive values for FREQ_INIT, DELTA_F and PHASE_INIT are shifted into FIFO buffers 60, 62 and 70 and control data which specifies the timing for signals T1–T8 is supplied to sequencer 56 via control bus 57. During synthesizer operation, sequencer 56 initially signals FIFO buffer 60 to shift a first value of FREQ_INIT to multiplexer 66 and switches multiplexer 77 to pass that value to the input to latch 68. Sequencer 56 also signals FIFO buffer 62 to send a first value of DELTA_F to adder 64 and signals FIFO buffer 70 to send a first value of PHASE_INIT to multiplexer 76. Sequencer 56 additionally signals multiplexer 76 to forward the first value of PHASE_INIT to the input to latch 78 and clocks latches 68 and 78 to pass the outputs of multiplexers 66 and 76 to adders 64 and 74. Thus the initial values of FREQ and PHASE are set to first FREQ_INIT and PHASE_INIT values.

Thereafter sequencer 56 switches multiplexers 66 and 76 to connect adder 64 and 74 outputs to latches 68 and 78 and then periodically operates latches 68 and 78 to accumulate the FREQ and PHASE data. If the frequency of the sample signal is to change in a non-linear fashion, sequencer 56 may also periodically shift a new DELTA_F value out of FIFO buffer 62. Each time zero crossing detector 54 detects a zero crossing of the PHASE data it generates a SAMPLE signal pulse. After sequencer 56 detects a predetermined number of SAMPLE signal pulses, it shifts new FREQ_INIT and PHASE_INIT values out of FIFO buffers 60 and 70 and latches them onto the inputs of multiplexers 66 and 76. Multiplexers 66 and 76 are then switched momentarily to pass these new values to latches 68 and 78, thereby to execute a frequency hop and to appropriately adjust the phase of the SAMPLE signal. The sequencer 56 then continues to clock latches 68 and 78 as before to produce a new SAMPLE frequency sweep starting with the new FREQ_INIT and PHASE_INIT values. Sequencer 56 may be programmed to terminate circuit operation after a predetermined number of frequency hops.

FIG. 7 is a block diagram illustrating the zero crossing detector of FIGS. 5 and 6. A digital-to-analog (D/A) converter 80 converts the digital PHASE signal to an analog signal PHASE_ANALOG of equivalent magnitude. A filter 82 smoothes the PHASE_ANALOG signal and supplies the result to a comparator 84. Comparator 84 compares the smoothed PHASE_ANALOG signal to 0 volts and produces an output SAMPLE signal pulse whenever the PHASE_ANALOG3 signal swings in either direction past 0 volts.

FIG. 8 is a block diagram illustrating the sequencer of FIGS. 5 and 6. A counter 90 produces output COUNT data indicating the number of signal pulses produced by a clock circuit 92 since the last frequency hop. A set of programmable decoders 94 decode the COUNT data in accordance with instructions provided by CONTROL DATA to produce the signals T1–T8 which control the timing of the various logic devices of FIG. 6. A counter 96 produces a HOP signal that resets counter 90 at each frequency hop. A FIFO buffer 98 stores a sequence of data indicating the number of SAMPLE signal pulse that are to occur between each successive frequency hop. When counter 96 produces a HOP signal, FIFO buffer 98 shifts a next data value onto a count limit input of counter 96. Counter 96 then counts SAMPLE signal pulses until it reaches the indicated limit. At that point, counter 96 generates a HOP signal pulse to signal the next frequency hop. A counter 99 counts SAMPLE signal pulses and generates an END signal whenever the number of SAMPLE signals reaches a predetermined limit. The END signal may be used to signify to an external controller that the synthesizer has, for example, completed a frequency sweep lasting a predetermined number of SAMPLE signal pulses. To program the synchronizer, an external controller such as a computer connected to the synchronizer via control bus 57, loads control data into decoders 94 (suitably random access memories), loads a data sequence into FIFO buffer 98, and supplies a count limit to counter 99. It then asserts a RESET signal conveyed on bus 57 which resets and enables counters 90, 96 and 99.

Thus has been described a signal source which can produce a high frequency output signal having a frequency which can vary with time over a wide frequency range in an accurately controllable manner. The signal source employs a programmable frequency hopping synthesizer producing an output signal which can smoothly or abruptly change frequency or phase in a well-controlled manner.

Thus while the foregoing specification has described preferred embodiment(s) of the present invention, one skilled in the art may make many modifications to the preferred embodiment without departing form the invention in its broader aspects. The appended claims therefore are intended to cover all such modifications as fall within the true scope and spirit of the invention.

I claim:

1. A signal source for producing an oscillating output signal having a frequency that varies with time, the signal source comprising:

oscillator means for producing the output signal, said output signal frequency being controlled by a frequency control signal supplied as input to said oscillator means;

waveform synthesizer means for producing an oscillating reference signal; and control means receiving said output signal and said oscillating reference signal for controlling the magnitude of said frequency control signal so as to phase lock said output signal to a harmonic of said reference signal, wherein said reference signal has a frequency that varies with time over a first range causing said output signal frequency to vary with time over a second range, said second range being broader, and a harmonic of said first range and wherein said reference signal frequency may change continuously over said first range during each of a plurality of consecutive time periods and changes abruptly between said consecutive time periods such that said output signal remains locked to a harmonic of said reference signal over said second range through a total time period encompassing all of said consecutive time periods.

2. The signal source in accordance with claim 1 wherein said waveform synthesizer means comprises:

data source means for providing output frequency change data, frequency initialize data and phase initialize data;

first accumulator means receiving said frequency change data and said frequency initialize data from said data source means for generating frequency data representing said reference signal frequency, said first accumulator means including means for setting a value of said frequency data to a value of said frequency initialize data and for periodically changing the value of said frequency data by a value of said frequency change data;

second accumulator means receiving said frequency data from said first means and receiving said phase initialize data from said data source means, for generating phase data representing a phase of said reference signal, said second accumulator means including means for setting a value of said phase data to a value of said phase initialize data and for periodically changing the value of said phase data by a value of said frequency data; and detector means for receiving said phase data for generating said reference signal, the phase and frequency of said reference signal being determined by said phase data.

3. The signal source in accordance with claim 2 wherein said data source means includes means for sequentially changing the value of said frequency initialize data and the value of said phase initialize data.

* * * * *